United States Patent [19]

Buck et al.

[11] Patent Number: 4,481,559

[45] Date of Patent: Nov. 6, 1984

[54] MOUNTING STRUCTURE FOR COMPONENTS OF ELECTRONIC SWITCHING DEVICE

[75] Inventors: Robert Buck, Neukirch; Norbert Lichte, Schlier, both of Fed. Rep. of Germany

[73] Assignee: i f m electronic GmbH, Essen, Fed. Rep. of Germany

[21] Appl. No.: 387,440

[22] Filed: Jun. 11, 1982

[30] Foreign Application Priority Data

Jun. 12, 1981 [DE] Fed. Rep. of Germany ....... 3123372

[51] Int. Cl.³ .............................................. H05K 1/14
[52] U.S. Cl. ................................... 361/395; 361/398; 174/68.5; 336/83
[58] Field of Search .................... 339/17 F; 174/52 R, 174/68.5; 361/179, 180, 331, 380, 395, 398, 399, 400, 410, 414, 417, 419; 336/83; 200/303

[56] References Cited

U.S. PATENT DOCUMENTS

| 3,304,468 | 2/1967 | Lawson | 361/395 |
| 3,745,095 | 7/1973 | Chadwick | 174/68.5 |
| 3,766,439 | 10/1973 | Isaacson | 361/398 |
| 3,967,162 | 6/1976 | Ceresa | 361/398 |
| 4,193,023 | 3/1980 | Buck | 361/180 |
| 4,217,624 | 8/1980 | Tuck | 361/380 |
| 4,225,748 | 9/1980 | Buck | 361/179 |
| 4,314,310 | 2/1982 | Schmidt | 361/380 |
| 4,388,672 | 6/1983 | Skill | 361/395 |

*Primary Examiner*—G. P. Tolin
*Attorney, Agent, or Firm*—Karl F. Ross; Herbert Dubno

[57] ABSTRACT

Electrical components of an electronic switching device, such as a motion sensor of a monitoring system, are mounted on a dielectric carrier film covering opposite surfaces of a flat non-conductive support. The several components, disposed on the outer surfaces of the carrier film, are electrically interconnected by leads in the form of conductor strips on the inner film surfaces. A coil constituting such a component is embedded in a ferrite pot which is pasted onto an extension of the film and has a central pin with an end insertable into an aperture in an edge of the flat support after that extension is bent around the edge. The surfaces of the support may be pitted to provide recesses for an adhesive designed to bond that support to the film.

12 Claims, 6 Drawing Figures

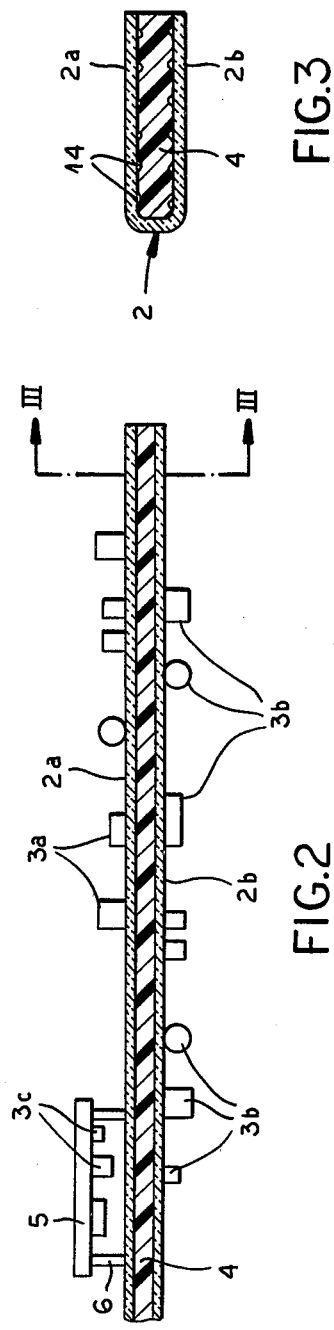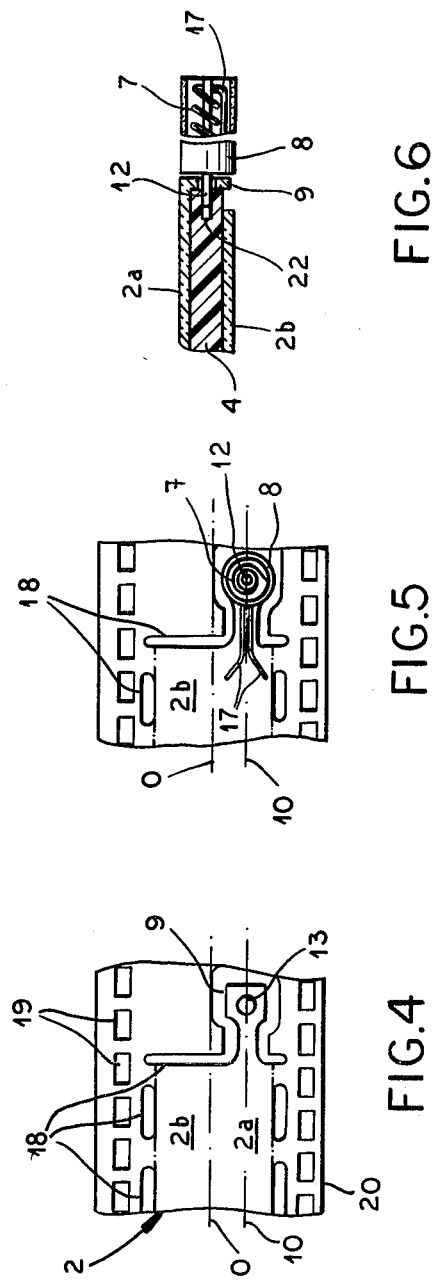

MOUNTING STRUCTURE FOR COMPONENTS OF ELECTRONIC SWITCHING DEVICE

FIELD OF THE INVENTION

Our present invention relates to a mounting structure for the components of an electronic switching device such as, for example, a motion sensor of a monitoring system designed to detect the approach or the departure of an extraneous object.

BACKGROUND OF THE INVENTION

A switching device of this nature has been disclosed in U.S. Pat. No. 4,225,748. That device comprises, essentially, a housing divided into two interfitting members, one of them forming a receptacle for a circuit unit which is covered by the other member and which has an end aperture traversed by a cable leading to an external power supply. Representative circuit arrangements for such a unit are disclosed in U.S. Pat. No. 4,193,023 and others mentioned therein.

The various components of a circuit unit of this type are advantageously mounted on a carrier in the form of a dielectric film and have connecting leads represented by conductor strips printed on that film. In the interest of a compact assembly it is desirable to minimize the separation of these circuit elements on the carrier surface, yet there are mechanical and electrical limits to the packing density that can be achieved.

OBJECT OF THE INVENTION

The object of our present invention, therefore, is to improve the utilization of available space on such a carrier with maintenance of the requisite minimum physical separation of the several circuit elements.

SUMMARY OF THE INVENTION

We realize this object, in accordance with our present invention, by the provision of a flat nonconductive support whose opposite sides are covered by a pair of dielectric layers, each layer having an exposed surface carrying a multiplicity of circuit elements interconnected by leads which are in the form of conductor strips printed on these layers as known per se.

Advantageously, pursuant to a more particular feature of our invention, all the conductor strips extend along the interfaces of the layers with their support, thus on the sides of the layers opposite their exposed surfaces.

The two layers preferably form part of a unitary carrier film folded about an edge of the support to which they may be secured by adhesive bonding.

According to a more particular feature of our invention, circuit elements which require a more massive base than a dielectric film or are otherwise incompatible with such a film (e.g. on account of a high heat development during operation) are mounted on an ancillary carrier—preferably of ceramic material—spacedly overlying one of the two layers; these latter elements can be electrically connected to the printed conductor strip of the film through spacing means holding the ancillary carrier in position.

When the device includes a wire coil, used for example as an inductance in the tank circuit of an oscillator forming part of a monitoring system of the aforementioned character, a direct mounting of that coil on the carrier film is not practical. In such a case we may encase the coil in a ferrite pot and attach the latter to an extension of one of the layers which can be bent around an edge of the flat support. This will leave the open end of the pot conveniently accessible, with its axis (coinciding with that of the coil) substantially paralleling the sides of the support so that no increase in the height of the structure becomes necessary.

BRIEF DESCRIPTION OF THE DRAWING

The above and other features of our invention will now be described in detail with reference to the accompanying drawing in which:

FIG. 2 is a longitudinal sectional view, taken on the line II—II of FIG. 1, showing a mounting structure according to our invention included in the device of FIG. 1;

FIG. 3 is a fragmentary cross-sectional view taken on the line III—III of FIG. 2 and drawn to a somewhat larger scale;

FIG. 4 is a fragmentary plan view of a carrier film for the structure of FIG. 2, shown in the process of formation;

FIG. 5 is a view similar to FIG. 4, showing an extension of the carrier film provided with a coil encased in a ferrite pot; and FIG. 6 is a fragmentary sectional view of the assembly of FIG. 5, showing the ferrite pot thereof in its working position.

SPECIFIC DESCRIPTION

Figure 1:
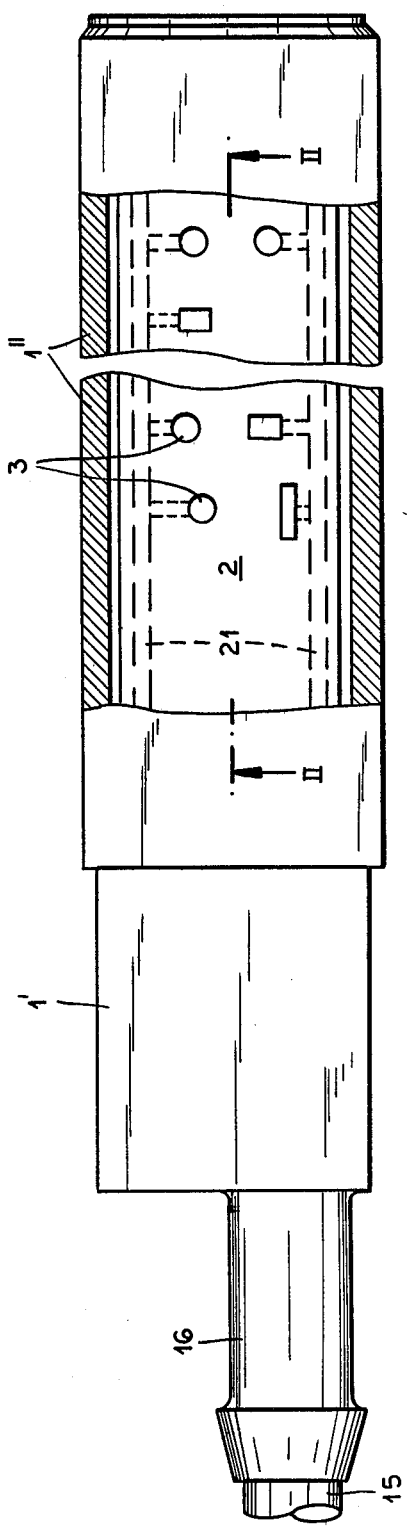
FIG. 1 is a plan view (partly broken away) of a switching device embodying our invention.

The device shown in FIG. 1 comprises a housing with a lower member 1' and an upper member 1'', the latter overlying a receptacle in member 1' which contains a mounting structure for a multiplicity of components 3 of an electronic circuit unit. Components 3, mounted on a flexible dielectric carrier film 2 in a manner more fully described hereinafter, are electrically connected via printed conductor strips 21 to wires of a cable 15 which traverses a port 16 of housing member 1'.

As seen in FIG. 2, carrier film 2 forms two layers 2a, 2b on opposite sides of a flat support 4 in the form of a thin plate of sufficiently rigid nonconductive material. The upper layer 2a carries circuit elements 3a while the lower layer 3b has additional components 3b attached thereto. As will be apparent from FIG. 3, the two layers are part of a single carrier film 2 folded about a longitudinal edge of supporting plate 4. The surfaces of this plate are pitted to provide a multiplicity of small recesses 14 for the accumulation of an adhesive which bonds the layers 2a, 2b to the plate and seeps by capillary action into the intervening zones of the interfaces between these layers and the plate 4. It is along these interfaces that the conductor strips 21 of FIG. 1 are printed on the film 2.

FIG. 2 also shows an ancillary carrier 5 which consists of rigid, preferably ceramic material and is spacedly supported on the upper layer 2a, on a part thereof free from components 3a, by rods 6 also serving as conductors for electrically connecting the strips 21 to say, highly heat-generating circuit components 3c mounted on carrier 5; spacing rods 6 are long enough to keep these components separated from layer 2a. Components 3c are protectedly located between carriers 2 and 5; this arrangement also avoids any significant increase in the height of the structure.

In FIGS. 4 and 5 we have shown the carrier 2 as part of a wider plastic web 20 from which this carrier is separable with the aid of slots 18 that are die-cut along its boundary. Web 20 is seen to be provided with two rows of perforations 19 allowing it to be transported by nonillustrated feed sprockets through a printing station and a subsequent die-cutting station. The end of carrier 2 seen in FIG. 4 has a longitudinal extension 9 bisected by a line 10 coming to lie midway along one of the two layers formed by the longitudinal halves of the film 2, here specifically the upper layer 2a, when the film is folded along its centerline O about a longitudinal edge of support plate 4. Extension 9 then forms a tab projecting longitudinally beyond a transverse edge of plate 4; this tab is designed to support a ferrite pot 8, FIG. 5, provided with a central pin 12 which passes through a hole 13 in tab 9 and is surrounded by an induction coil 7 received in pot 8. When the tab 9 is bent through 90° about a transverse edge of plate 4, as shown in FIG. 6, pin 12 is received in an aperture 22 of the plate to hold the pot 8 firmly in position. With the axis of coil 7 and pot 8 now centered relatively to the elongate film-coated support 4, in line with the major dimensions of that support, wires 17 connected to the extremities of the coil are readily accessible through the open end of the pot. The position of the pot 8 and the tab 9 shown in FIG. 6 can be stabilized by cementing.

If the film 2 is to be folded about a transverse rather than a longitudinal edge of plate 4, i.e. about the edge opposite the one visible in FIG. 6, the tab 9 ought to be relocated so as to be bisected by the centerline O.

We claim:

1. A mounting structure for components of an electronic switching device, comprising:
   a housing;
   a flat nonconductive elongate support in said housing,
   a pair of dielectric layers of flexible film material covering opposite sides of said support;
   a multiplicity of first circuit elements secured to an exposed surface of each of said layers, said circuit elements being electrically interconnected by conductor strips on said layers; and
   an ancillary carrier of rigid material secured to and spacedly overlying a part of one of said layers free from said first circuit elements, at least one second circuit element being disposed on said ancillary carrier between the latter and said one of said layers.

2. A mounting structure as defined in claim 1 wherein said conductor strips extend along interfaces of said layers with said support.

3. A mounting structure as defined in claim 1 or 2 wherein said ancillary carrier consists of ceramic material.

4. A mounting structure as defined in claim 1 or 2 wherein said ancillary carrier is secured to said one of said layers by spacing means electrically connecting said second circuit element to one of said conductor strips, said spacing means being long enough to keep said second circuit element separated from said one of said layers.

5. A mounting structure as defined in claim 1 or 2 wherein said layers are part of a unitary carrier film folded about an edge of said support.

6. A mounting structure as defined in claim 1 wherein said ferrite pot is provided with a central pin received in an aperture of said edge.

7. A mounting as defined in claim 1 or 2 wherein said layers are adhesively bonded to said support.

8. A mounting structure as defined in claim 7 wherein said support has pitted surfaces forming a multiplicity of adhesive-receiving recesses.

9. A mounting structure for components of an electronic switching device, comprising:
   a housing;
   a flat nonconductive elongate support in said housing;
   a pair of dielectric layers of flexible film material covering opposite sides of said support;
   a multiplicity of circuit elements secured to an exposed surface of each of said layers, said circuit elements being electrically interconnected by conductor strips on said layers, one of said layers being provided with an integral extension bent around a transverse edge of said support; and
   a coil encased in a ferrite pot, said ferrite pot having a closed end secured to said extension and an axis in line with the major dimension of said support.

10. A mounting structure as defined in claim 9 wherein said conductor strips extend along interfaces of said layers with said support.

11. A mounting structure as defined in claim 9 or 10 wherein said layers are part of a unitary carrier film folded about an edge of said support.

12. A mounting structure for components of an electronic switching device, comprising:
    a housing;
    a flat nonconductive elongate support in said housing;
    a pair of dielectric layers of flexible film material covering opposite sides of said support;
    a multiplicity of first circuit elements secured to an exposed surface of each of said layers, said circuit elements being electrically interconnected by conductor strips on said layers;
    an ancillary carrier of rigid material spacedly overlying a part of one of said layers, at least one second circuit element being disposed on said ancillary carrier between the latter and said one of said layers; and
    spacing means securing said ancillary carrier to said one of said layers while electrically connecting said second circuit element to one of said conductor strips, said spacing means being long enough to keep said second circuit element separated from said one of said layers.

* * * * *